United States Patent [19]

Brown et al.

[11] Patent Number: 5,677,245

[45] Date of Patent: Oct. 14, 1997

[54] SMALL OUTLINE OPTOCOUPLER PACKAGE METHOD

[75] Inventors: Clem H. Brown, Scottsdale; John E. Salina, Phoenix, both of Ariz.

[73] Assignee: Motorola, Inc., Schaumburg, Ill.

[21] Appl. No.: 454,471

[22] Filed: May 30, 1995

Related U.S. Application Data

[62] Division of Ser. No. 298,697, Aug. 31, 1994, Pat. No. 5,489,800.

[51] Int. Cl.$^6$ .................................................. H01L 21/60
[52] U.S. Cl. .................................................. 437/209; 437/220
[58] Field of Search .................................. 437/209, 220, 437/905; 257/82, 666

[56] References Cited

U.S. PATENT DOCUMENTS

| | | | |
|---|---|---|---|
| 3,993,529 | 11/1976 | Farkas | 156/380 |
| 4,755,474 | 7/1988 | Moyer | 437/209 |
| 4,794,431 | 12/1988 | Park | 257/82 |
| 4,857,746 | 8/1989 | Kuhlmann | 437/905 |
| 5,049,527 | 9/1991 | Merrick | 437/220 |
| 5,521,992 | 5/1996 | Chun et al. | 257/666 |

OTHER PUBLICATIONS

Websters Ninth New Collegiate Dictionary, 1984, p. 221, Merriam–Webster Inc, month not provided.
Webster's Third New International Dictionary, 1967, page unknown, month unknown, G & C Merriam Company.

*Primary Examiner*—John Niebling
*Assistant Examiner*—Michael S. Lebentritt
*Attorney, Agent, or Firm*—Robert D. Atkins

[57] ABSTRACT

A leadframe (10) architecture provides placement of multiple optocoupler pair devices (45, 50) in a minimum size footprint package. A detector flag (20) and LED flag (12) are placed on a common centerline (26) within the footprint. A critical length is determined for packaging factors lying along the centerline. The angle (28) formed between the centerline and the longitudinal axis (24) controls the optocoupler pair fit within the package. The angle (28) is calculated by taking the arc-sine function of the critical length divided by the footprint width.

9 Claims, 3 Drawing Sheets

SMALL OUTLINE OPTOCOUPLER PACKAGE METHOD

This is a division of application Ser. No. 08/298,697, filed Aug. 31, 1994, now U.S. Pat. No. 5,489,800.

BACKGROUND OF THE INVENTION

The present invention relates in general to semiconductor optocoupler device packages and, more particularly, to the architecture of a surface mount package single plane leadframe.

Semiconductor optocouplers are used extensively to couple electronic signals between low voltage circuits and high voltage circuits. The optocoupler offers an advantage of providing electrical isolation between the two circuits, thus reducing interface problems that are commonly known in the art. An example of such an application is the interface between an electric motor and a microprocessor used to control the motor. It is not only advantageous to control the motor with the microprocessor, but it is also beneficial to provide feedback to the microprocessor as to the operating status of the motor. This type of application requires at least a pair of optocouplers to successfully perform the interface function.

In the past, optocouplers have been packaged in TO-5, TO-18, and in 8-lead dual in-line packages. Due to industry views of JEDEC standard case outline size and footprint limitations, coupled with UL1577 and VDE884 standards constraints, only one optocoupler pair could be housed effectively in a given package. Thus two packages are required to facilitate a desired motor application. Furthermore, the TO-5, TO-18, and dual in-line packages are inherently expensive. Extra expense is incurred in the optocoupler dual in-line configuration because two lead frames are required to facilitate mounting of more than one optocoupler pair in the smaller JEDEC outline limited space. With this technology, each component of the optocoupler pair is mounted on its respective lead frame in opposition to the other component. This configuration leads to other manufacturing problems such as optocoupler component alignment. Because of footprint constraint, this package implementation cannot facilitate the requirement of two optocoupler pairs in one package. Therefore, a cost effective solution has not been achieved for practical applications of optical isolation.

To further reduce the cost of an optocoupler system, it is also desirable to miniaturize the system by migrating toward surface mount component technology. It is generally known in the art that surface mount technology is more cost effective from both a manufacturing and component viewpoint.

Hence, a need exists for a small outline surface mount package having a single plane leadframe architecture that is capable of accommodating multiple optocoupler device die pairs.

DETAILED DESCRIPTION OF THE PREFERRED EMBODIMENT

The present invention is an electronic package leadframe architecture and method for arranging multiple optocoupler die pair devices in a minimum single standard outline package. The optocoupler die pairs are mounted in an opposing fashion on a single plane lead frame using standard mounting techniques. A detector mounting flag (pad) and a light emitting diode (LED) flag are configured such that the optocoupler die pair maintain a common centerline. The common centerline forms a predetermined interior angle with the longitudinal axis of the package. The common centerline bisects the LED flag and the associated detector flag. The method of selecting the predetermined angle optimizes the leadframe for a given package footprint and permits more than one optocoupler die pair to be mounted on the leadframe while conforming to regulatory and manufacturing requirements for the optocoupler device.

Optocouplers are semiconductor devices that contain at least one emitter, which is optically coupled to a photo detector through some sort of an insulating medium. The emitter may be an LED while the detector is a phototransistor. This arrangement permits the optical passage of electrical information from an input circuit, which contains the emitter, to an output circuit containing the detector. Dual channel optocouplers that contain two independent optocouplers that are used in interface applications requiring higher component densities, simplification of printed circuit board design, or concurrent control and feedback signal paths.

Figure 1:
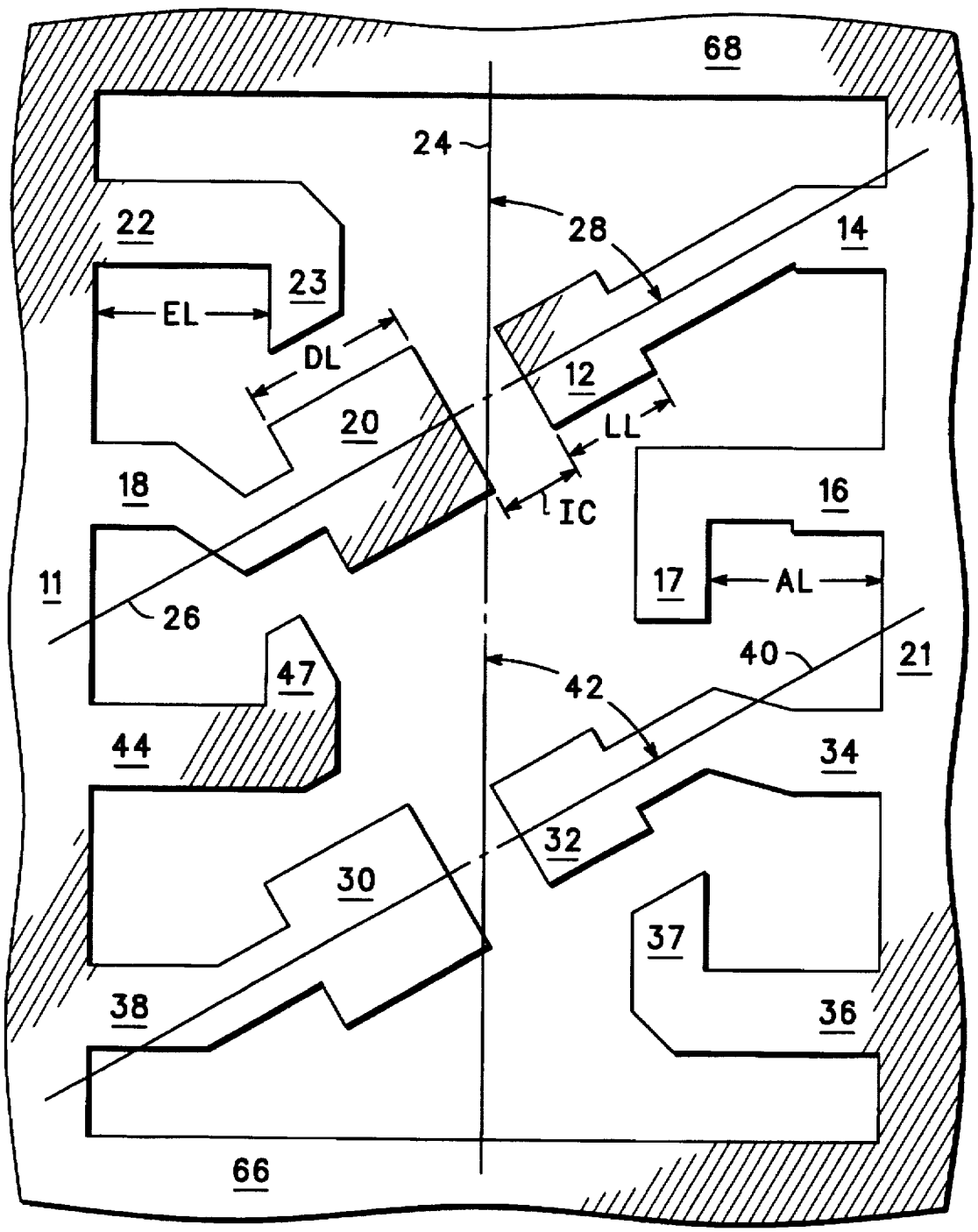
FIG. 1 illustrates a top view of a portion of a leadframe strip.

Referring to FIG. 1, a single plane leadframe 10 for a dual channel, SO-8 Standard Small Outline Plastic Package, 8 pin optocoupler is shown within a molded body. Leadframe 10 includes LED flag 12 and phototransistor detector flag 20 for mounting a photocoupler emitter-detector die pair. Likewise, LED flag 32 and phototransistor detector flag 30 are furnished to accommodate the mounting of a second photocoupler emitter-detector die pair. Emitter flags 23 and 47 provide wire bond sites respectively for the phototransistor detector die that are mounted to phototransistor detector flags 20 and 30. Anode flags 17 and 37 provide wirebond sites respectively for LED emitter die that are mounted to LED flags 12 and 32. Emitter flags 23 and 47 are coupled to one end of emitter leads 22 and 44 respectively. Phototransistor detector flags 20 and 30 are coupled to one end of collector leads 18 and 38 respectively. The opposite ends of emitter lead 22, collector lead 18, emitter lead 44, and collector lead 38 are coupled in common to dam bar 11. LED flags 12 and 32 are coupled to one end of cathode leads 14 and 34 respectively. One end of anode leads 16 and 36 are coupled to anode flags 17 and 37, respectively. The opposite ends of cathode lead 14, anode lead 16, cathode lead 34, and anode lead 36 are coupled in common to dam bar 21. Dam bars 11 and 21 are coupled to siderails 66 and 68 in a continuous fashion. The relationship of dam bars 11 and 21 to siderails 66 and 68 is generally known in the industry. Longitudinal axis 24 defines the centerline of leadframe 10 and is equally displaced between dam bar 11 and dam bar 21. LED flag 12 is configured within leadframe 10 with a centerline 26 that is common to detector flag 20. The common centerline bisects the LED flag 12 and the associated detector flag 20. Likewise, LED flag 32 is configured within leadframe 10 with a centerline 40 that is common to detector flag 30. Centerline 26 is parallel to centerline 40.

In determining the optimum architecture configuration for leadframe 10, the position of emitter leads 22 and 44, collector leads 18 and 38, cathode leads 14 and 34, and anode leads 16 and 36 are dictated by the given package footprint. The angles 28 and 42 that are formed at the intersection of centerlines 26 and 40 with respect to longitudinal axis 24 must be considered in the leadframe 10 architecture design. There are several factors that influence the determination of angles 28 and 42. One such factor is the overall SO-8 package size. Another factor is related to industry accepted package dimensioning incorporated by the JEDEC standard established for the SO-8 package footprint. Restrictions for the standard SO-8, CASE 846-01 dimensions are 0.182 to 0.202 inches by 0.144 to 0.164 inches for package body size, with lead spacing (between leads) of 0.050 inches. Side to side lead spacing is 0.224 to 0.244 inches.

Figure 3:
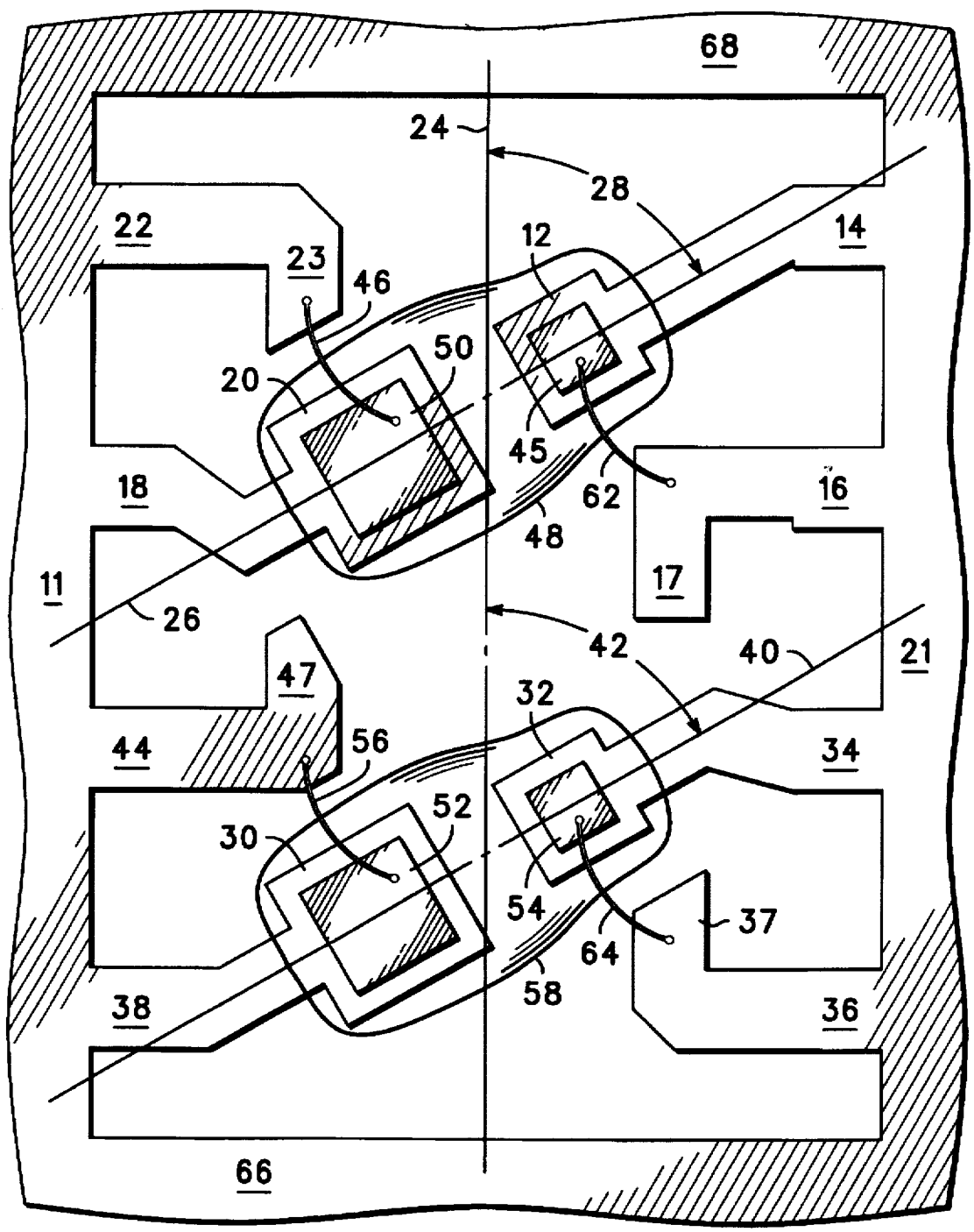
FIG. 3 illustrates an application of the leadframe of FIG. 1 showing a configuration of two optocoupler die pairs.

The JEDEC standard was developed with the thought of mounting a single die within the package on a centrally located die bond pad. Other requirements are imposed on optocoupler leadframe 10 design due to regulatory agency requirements for SO-8 applications. One such requirement is an output isolation voltage of 2500.0 volts RMS at 60 Hz AC. for a duration of one second. The 2500.0 voltage isolation requires a minimum spacing between the emitting and detecting conductors of 17.5 mils. The 17.5 mils is the distance between detector flag 20 and LED flag 12 and also the distance between detector flag 30 and LED flag 32. Further constraints are imposed by the electrical isolation required between die bond flags such as detector flags 20 and 30, and wire bond flags, such as emitter flags 23 and 47, respectively. Similarly, electrical isolation between LED flags 12 and 32 and anode flags 17 and 37 respectively must be realized. For this optoelectronic application, the spacing must be a minimum of 15 mils. All of these factors influence the selection of angles 28 and 42. A secondary factor that impacts the architecture of leadframe 10 is the placement of die caps 48 and 58 as shown in FIG. 3. Space within leadframe 10 must be adequate to provide for elliptical shaped die caps 48 and 58 so that optimal optical transmission is achieved between LED die 45 and photo-transistor die 50 and between LED die 54 and photo-transistor die 52 as shown in FIG. 3.

The following is an example of how the optimal lead frame configuration of FIG. 1 was determined. Emitter leads 22 and 44; collector leads 18 and 38; cathode leads 14 and 34; and anode leads 16 and 36 are dimensioned as required by JEDEC standard specifications. The emitter flags 23 and 47, and anode flags 17 and 37 are selected to be 0.054 inches in width. This width is adequate to facilitate wire bonding. Detector flags 20 and 30 are designated as 0.025 inches by 0.025 inches. LED flags 12 and 32 are chosen to be 0.015 inches by 0.015 inches. Flag dimensions are selected to accommodate the mounting of semiconductor die upon the flags. Regulatory standards indirectly require that the space between LED flag 12 and detector flag 20 be a minimum of 0.0175 inches. Similarly the space between LED flag 32 and detector flag 30 must be a minimum of 0.0175 inches. Die cap 48 and die cap 58 clearance is specified as a minimum of 0.005 inches. The object of this example is to determine the magnitude of angles 28 and 42 that allow the placement of two optocoupler die pair in one SO-8 package footprint. The calculation for angle 28 is performed using a relationship for one optocoupler die pair. The same angle magnitude is applied to angle 42 to complete the required architecture for leadframe 10. The first step in determining optimum angles 28 and 42 is to calculate the critical path CP dimensions which are defined by detector flag 20 length DL, LED flag 12 length LL, emitter lead 22 length EL, anode lead 16 length AL, isolation clearance IC, and die cap clearance DC. Detector flag 20 length DL, LED flag 12 length LL, and emitter lead 22 length EL, anode lead 16 length AL, and isolation clearance IC are as shown in FIG. 1. Die cap clearance DC is the minimum distance between die cap 48 and emitter flag 23 or anode flag 17. Per the present invention, the formula for calculating the critical path length is given in equation (1) as:

$$CP=DL+LL+EL+AL+IC+DC \quad (1)$$

For the present example CP is 0.1705 inches. If the critical path length was equal to or less than the width W of leadframe 10, the leadframe, although not optimized, could be designed with angle 28 being equal to 90 degrees. Since the critical path length 0.1705 inches is greater than the width of leadframe 10, centerline 26 cannot be at a 90 degree angle to longitudinal axis 24. Therefore, another step must be performed to determined the required angle 28. The next step in determining optimum angle 28 is completed in the present invention by dividing the minimum leadframe 10 width by the critical path dimension. The inverse sine function is taken of the resulting number and the associated angle magnitude is angle 28. The equation $$angle\ 28 = \sin^{-1} CP/W \quad (2)$$

results in a magnitude of 57.63 degrees for angle 28 which is also imposed for angle 42. Thus, the resultant angles 28 and 42 are optimized so that the a given optocoupler die pair fit within the constraints of the footprint of the package and leadframe 10.

Detector flags 20 and 30 along with LED flags 12 and 32 are located within the leadframe footprint, per the dimensioning constraints previously listed, and with their respective centerlines 26 and 40 aligned and positioned as dictated by angles 28 and 42. It should be noted that the preceding example reflects one set of prescribed dimensions for a given SO-8 JEDEC footprint requirement. After final adjustments were made for tooling tolerances and manufacturer's leadframe tolerances, angles 28 and 42 were adjusted to 62.8 degrees. The determination of angle 28, and correspondingly angle 42, vary with varying manufacturing and process tolerances. Therefore, the principle of the present invention can be extended to other rectangular and square package footprints as well. When using the method for square footprints, longitudinal axis 24 are defined as the centerline of the footprint that bisects the package with leads appearing on opposite sides of the longitudinal axis 24.

Leadframe 10 is produced in a strip form from a stamping tool using stamping techniques known in the art. The tool is set up in accordance with a dimensioned leadframe strip drawing. Materials selected for leadframe 10 are alloy 42 although copper may also be used as an alternative.

Figure 2:
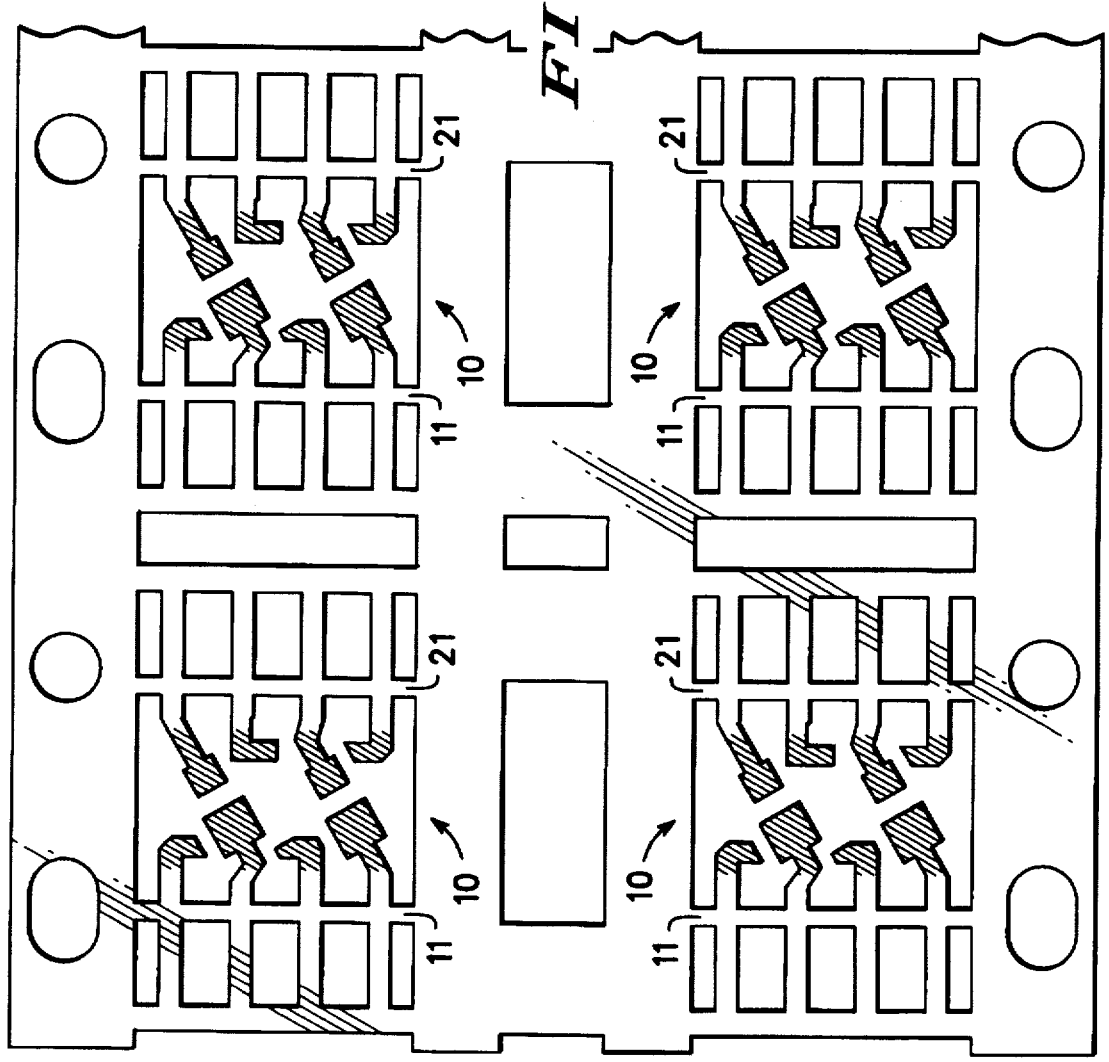
FIG. 2 illustrates a portion of a leadframe strip containing the leadframe portion.

Turning to FIG. 2, a portion of leadframe strip 70 is shown containing a multiple arrangement of leadframe 10. Leadframe strip 70 is dimensioned to incorporate the architecture of leadframe 10 that is generated in accordance with the present invention. Leadframe strip 70 is also dimensioned to be compatible with manufacturing tooling that is used to mold, trim singulate, and form the final packaged optocoupler device. The details of these manufacturing operations are known to those who are skilled in the art. For the example of FIG. 1, two rows of 24 leadframes 10 co-exist in a pattern to define leadframe strip 70. However, in practice, leadframe strips are not limited to the number or the arrangement of individual leadframes 10 used for this example.

Referring to FIG. 3, further details of an optocoupler application utilizing the present invention are shown. Leadframe 10 appears as described for FIG. 1. In addition to the components shown in FIG. 1, FIG. 3 includes phototransistor die 50 and 52 that are mounted on detector flags 20 and 30 respectively. LED die 45 and 54 are mounted on LED flags 12 and 32 respectively. Bondwires 46, 56, 62, and 64 couple phototransistor 50 to emitter flag 23, phototransistor 52 to emitter flag 47, LED die 45 to anode flag 17, and LED die 54 to anode flag respectively. Die cap 48 covers phototransistor die 50 and LED die 45 while die cap 58 covers phototransistor die 52 and LED die 54.

Leadframe 10 architecture is manifested in accordance with the present invention. Leadframe 10 is constructed of alloy 42 material. LED die 45 is fabricated from gallium arsenide and is attached to LED flag 12 using conventional gold eutectic die attach techniques. The backside of LED die 45 is the cathode contact for the LED and is coupled through cathode lead 14. The anode contact of LED die 45 appears on the topside of the die and is coupled to anode flag 17 through wirebond 62. Phototransistor die 50 is fabricated from silicon and mounted to detector flag 20 using gold eutectic die attach techniques. The backside of phototransistor die 50 is the collector contact and is coupled through collector lead 18. The emitter contact for phototransistor die 50 resides on the top surface of the die. The emitter contact is coupled to emitter flag 23 through bond wire 46. LED die 45 and phototransistor die 50 form an optocoupler die pair. Light signals generated by the LED are transmitted through an optical medium, in this case die cap 48, to the base of phototransistor 50. In a like manner, phototransistor die 52 and LED die 54 are attached to detector flag 30 and LED flag 32 respectively and are coupled to the respective collector lead 38 and cathode lead 34. Wirebond 56 couples phototransistor die 52 emitter contact to emitter flag 47 and wirebond 64 couples the anode contact of LED die 54 to anode flag 37. Phototransistor die 52 and LED die 54 form a second optocoupler die pair and are covered by die cap 58 which provides an optical medium between the die pair. Phototransistor die 50 and 52 fit within the perimeter of their respective detector flags 20 and 30. Likewise, LED die 45 and 54 fit within the perimeter of their respective LED flags 12 and 32.

Although gold eutectic die attach has been used in the above example, conductive epoxy die attach can be used equally as well. Wirebonds 46, 56, 62, and 64 are made of gold composition and are affixed using thermosonic methods. Alternatively, they may be of aluminum composition material. As known in the art, phototransistor die 50 and 52 may be equivalently replaced by photo detector diodes. Die caps 48 and 58 are a silicone material that exhibit optical transmission and dielectric insulation characteristics. The silicone material is applied to the photocoupler die pair as a liquid injected through a needle. The liquid cures in ambient atmosphere and requires 50.0 to 70.0 percent relative humidity during the curing process.

Once the assembly of leadframe 10 is completed, leadframe strip 70 is submitted to a molding process that forms a molded body that covers the LED flags, the semiconductor die, the detector flags, the package leads, and the wirebonds. The molding process is transfer epoxy molding and is known to those skilled in the art. Once the molding operation is completed, the molded leadframe strip 70 assembly undergoes a singulation operation. During the singulation operation, dam bars 11 and 21, as well as siderails 68 and 66, are removed from the leadframe strip 70. The singulation operation is known in the art. The leads are next trimmed to the required length and are formed to complete the assembled SO-8 optocoupler package.

By now it should be appreciated that the present invention provides an optimized leadframe architecture for an optocoupler electronic application that can be placed in a minimum size package. The optimized leadframe architecture permits multiple optocoupler pair devices to be mounted in a single surface mount type electronic package. Thus, component and associated system and manufacturing costs are significantly reduced.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method for forming an optocoupler package, comprising the step of providing a leadframe having a plurality of leads and including first and second die mounting flags respectively coupled to first and second leads of said plurality of leads and arranged along a first common centerline of said first and second die mounting flags that forms a first interior angle between said first common centerline and a longitudinal axis that bisects said leadframe, said leadframe further including third and fourth die mounting flags respectively coupled to third and fourth leads of said plurality of leads and arranged along a second common centerline of said third and fourth die mounting flags that forms a second interior angle between said second common center line and said longitudinal axis.

2. The method of claim 1 wherein said first interior angle is determined from an arc-sine of a ratio of a critical path length of said leadframe to a width of said leadframe.

3. The method of claim 2 wherein said first and second interior angles are equivalent.

4. The method of claim 3 further including the step of providing a plurality of wirebond flags where a first one of said plurality of wirebond flags is coupled to a fifth lead of said plurality of leads and a second one of said plurality of wirebond flags is coupled to a sixth lead of said plurality of leads.

5. A method for forming an optocoupler package, comprising the step of providing a leadframe having a plurality of leads and including first and second die mounting flags respectively coupled to first and second leads of said plurality of leads and arranged along a first common centerline of said first and second die mounting flags that bisects a center of said first and second die mounting flags and forms a first interior angle between said first common center line and a longitudinal axis that bisects a center of said leadframe.

6. The method of claim 5 further wherein said leadframe further including third and fourth die mounting flags respectively coupled to third and fourth leads of said plurality of leads and arranged along a second common centerline that bisects a center of said third and fourth die mounting flags and forms a second interior angle between said second common center line and said longitudinal axis.

7. The method of claim 6 wherein said first interior angle is determined from an arc-sine of a ratio of a critical path length of said leadframe to a width of said leadframe.

8. The method of claim 7 wherein said first and second interior angles are equivalent.

9. The method of claim 8 further including the step of providing a plurality of wirebond flags where a first one of said plurality of wirebond flags is coupled to a fifth lead of said plurality of leads and a second one of said plurality of wirebond flags is coupled to a sixth lead of said plurality of leads.

\* \* \* \* \*